(12) United States Patent
Therisod

(10) Patent No.: US 6,556,050 B2
(45) Date of Patent: Apr. 29, 2003

(54) HIGH SPEED SIGNAL WINDOW DETECTION

(75) Inventor: Stefano G. Therisod, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/734,795

(22) Filed: Dec. 11, 2000

(65) Prior Publication Data

US 2002/0070767 A1 Jun. 13, 2002

(51) Int. Cl.[7] .............................................. H03K 5/153
(52) U.S. Cl. ............................................ 327/74; 327/76
(58) Field of Search .............................. 327/74, 75, 76, 327/82, 89

(56) References Cited

U.S. PATENT DOCUMENTS 4,055,777 A * 10/1977 Black ........................... 327/85
6,028,464 A *  2/2000 Bremner ....................... 327/74

* cited by examiner

Primary Examiner—Kenneth B. Wells
(74) Attorney, Agent, or Firm—Pamela Lan Kee

(57) ABSTRACT

A window detector circuit for high frequency applications includes a differential amplifier that has two inputs which receive a differential voltage signal. A bias network, having a balancing node, connected between the two inputs. An output transistor, electrically biased by the balancing node, connected between power and ground. In operation, when the differential voltage signal is below a voltage threshold, the differential amplifier is turned off and current flows through the output transistor. When the differential voltage signal is at or exceed the voltage threshold, the differential amplifier turns on.

8 Claims, 2 Drawing Sheets

CIRCUIT DIAGRAM OF SIGNAL WINDOW DETECTION CIRCUIT

CIRCUIT DIAGRAM OF SIGNAL WINDOW DETECTION CIRCUIT

HIGH SPEED SIGNAL WINDOW DETECTION

FIELD OF THE INVENTION

The invention is directed towards the field of signal detection, particularly towards signal detection circuits that differentiate between signal and noise.

BACKGROUND

Window detectors are used in applications where it must be determined if a signal falls within a specified range. In the prior art, they are implemented using two threshold comparators and two reference signals. While it the performance is device dependent, this circuit topology may only be used for signals having a frequency less than 100 MHz. The performance of the circuit is limited by the frequency of the comparators.

SUMMARY

A window detector circuit for high frequency applications includes a differential amplifier that has two inputs which receive a differential voltage signal. A bias network, having a balancing node, is connected between the two inputs. An output transistor, electrically biased by the balancing node, is connected between power and ground.

In operation, when the differential voltage signal is below a voltage threshold, the differential amplifier is turned off and current flows through the output transistor. When the differential voltage signal is at or exceeds the voltage threshold, the differential amplifier turns on.

DETAILED DESCRIPTION

Figure 1:
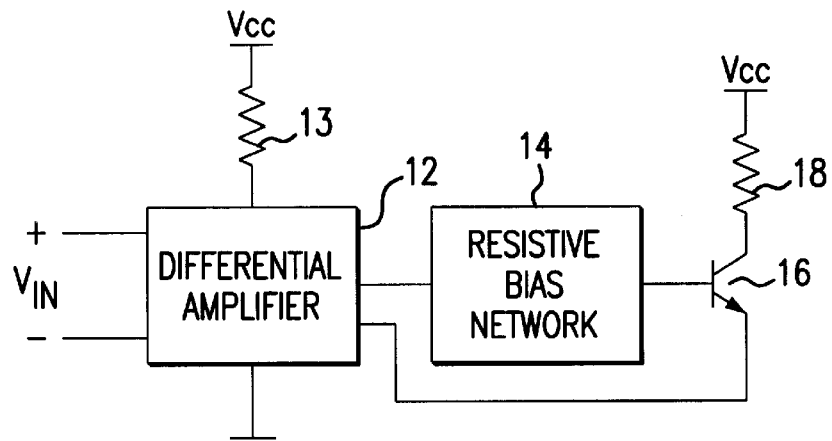
FIG. 1 illustrates a functional block diagram of a window detector circuit 10 of the present invention.

FIG. 1 illustrates a functional block diagram of a window detector circuit 10 of the present invention. A differential amplifier 12, having a positive and negative input, is connected between a differential resistor 13 and ground. The differential resistor 13 is further connected to power. Each input receives a differential voltage signal. A resistive bias network 14 connects between the positive and negative inputs. An output transistor 16 is connected between an output resistor 18 and ground and is electrically biased by the resistive bias network 14. The output resistor 18 is further connected to power.

In operation, when the differential voltage signal is below a voltage threshold, the differential amplifier is turned off and current flows through the output transistor. When the differential voltage signal is at or exceeds the voltage threshold, the differential amplifier turns on. The maximum operating frequency depends solely on the cut off frequency of the transistors selected.

Figure 2:
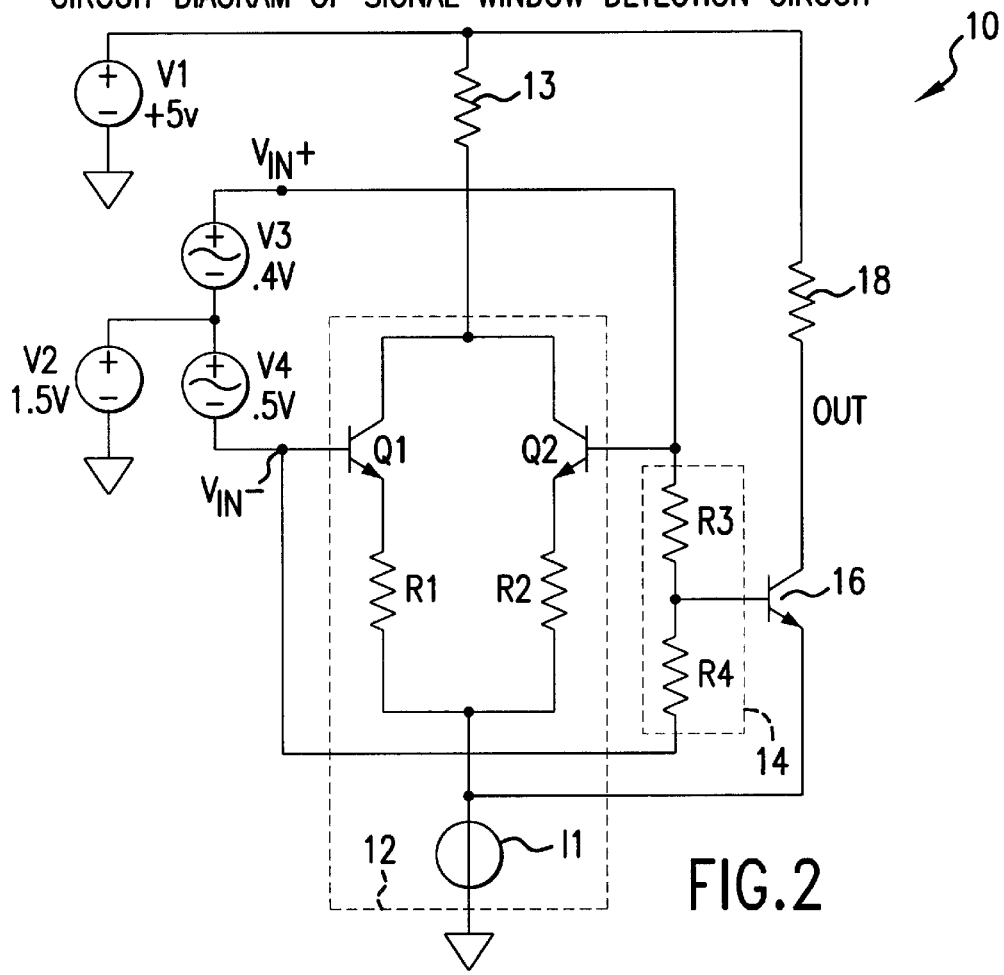
FIG. 2 illustrates a circuit schematic diagram corresponding to the functional block diagram shown in FIG. 1.

FIG. 2 illustrates a circuit schematic diagram corresponding to the functional block diagram shown in FIG. 1. The differential amplifier 12 includes a first and second bipolar transistor Q1, Q2. The first bipolar transistor Q1 receives the positive input while the second bipolar transistor Q2 receives the negative input. The emitter of the first bipolar transistor Q1 is connected to a first degenerating resistor R1 while the emitter of the second bipolar transistor Q2 is connected to a second degenerating resistor R2. A current source I1 interposes ground and the first and second degenerating resistors R1, R2. The first and second degenerating resistors R1, R2 preferably have comparable impedance. The resistive bias network 14 is a voltage divider. If the values of the biasing resistors R3, R4 are equal and the values of the first and second degenerating resistors R1, R2 are equal, the detected window will be symmetrical. The bias network 14 may include an optional current compensation circuit (not shown) connected to the bias point for compensate for the base current into the output transistor Q3.

Figure 3:
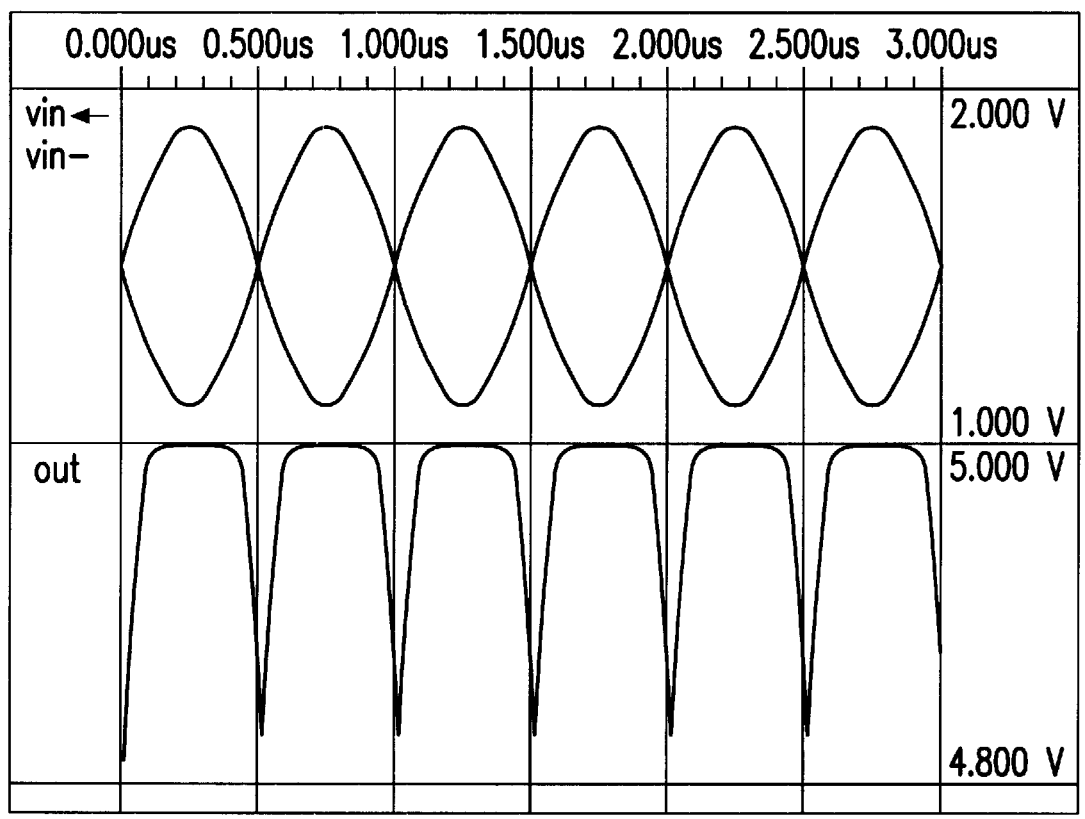
FIG. 3 illustrates a circuit simulation corresponding to the embodiment shown in FIG. 2.

Since degenerating resistors R1, R2 are connected to the first and second bipolar transistors Q1, Q2, the voltage differential applied across their respective bases is small. The differential amplifier 12 is essentially turned off. The current flows through the output transistor 16 and output resistor 18. The output of the window detector is low. When the differential input signal is large enough to turn on either the first or second bipolar transistor, the current is diverted from the output resistor 18 to the differential resistor 13. The output of the window detector is then high. The low voltage level depends upon many parameters, e.g. process, device size and ratio, value of the degenerative resistors, and current supplied by the current source. FIG. 3 illustrates a circuit simulation corresponding to the embodiment shown in FIG. 2.

The circuit schematic diagram disclosed in FIG. 2 is an illustrative example of the present invention. While the embodiment uses bipolar transistors, it would be apparent to one with skill in the art that the inventive concept could be applied to field effect transistors.

I claim:

1. A window detector circuit having a differential input coupled to receive a differential voltage signal and having an output, the window detector circuit comprising:

a differential amplifier, having a positive and negative input, each input receiving the differential voltage signal, connected between power and ground;

a bias network, connected between the positive and negative inputs, having a bias point; and an output transistor, electrically biased by the bias point, connected between power and ground and directly connected to the window detector circuit output.

2. A window detector circuit, as defined in claim 1, the differential amplifier further comprising:

a first transistor, receiving the positive input, having an output;

a second transistor, receiving the negative input, having an output;

a current source connected between ground and the outputs of the first and second transistors.

3. A window detector circuit, as defined in claim 2, the differential amplifier further comprising:

a first resistor interposing the first transistor output and the current source; and a second resistor interposing the second transistor output and the current source.

4. A window detector circuit, as defined in claim 3, wherein the first and second resistors (R1, R2) have equal values.

5. A window detector circuit, as defined in claim 3, the bias network further comprising:

a first biasing resistor electrically interposing the positive input and the bias point; and a second biasing resistor electrically interposing the bias point and the negative input.

6. A window detector circuit, as defined in claim 5, wherein the first and second biasing resistors (R3, R4) have equal values.

7. A window detector circuit, as defined in claim 1, the bias network further comprising:

a first biasing resistor electrically interposing the positive input and the bias point; and a second biasing resistor electrically interposing the bias point and the negative input.

8. A window detector circuit, as defined in claim 7, wherein the first and second biasing resistors (R3, R4) have equal values.

* * * * *